United States Patent
Pearlman

[11] Patent Number: 5,805,062
[45] Date of Patent: Sep. 8, 1998

[54] 2-WIRE OPTOVOLTAIC LOOP-POWERED ISOLATION AMPLIFIER WITH CURRENT BOOTSTRAPPING

[75] Inventor: Alan R. Pearlman, Newton Highlands, Mass.

[73] Assignee: Mini-Systems, Inc., N. Attleboro, Mass.

[21] Appl. No.: 729,642

[22] Filed: Oct. 21, 1996

[51] Int. Cl.[6] .................................................. G08B 29/00
[52] U.S. Cl. ........................ 340/508; 340/555; 359/143; 359/187
[58] Field of Search ................................... 340/508, 555, 340/556, 557; 307/117; 359/143, 187, 161, 171; 324/96

[56] References Cited

U.S. PATENT DOCUMENTS

| | | | |
|---|---|---|---|
| 3,770,966 | 11/1973 | Sagawa et al. | 359/187 |
| 4,070,572 | 1/1978 | Summerhayes | 359/187 |
| 4,488,305 | 12/1984 | Claverie et al. | 359/187 |
| 4,959,642 | 9/1990 | Sharples | 340/716 |
| 5,068,545 | 11/1991 | Molnar | 307/311 |
| 5,146,100 | 9/1992 | Banaska | 250/551 |
| 5,182,456 | 1/1993 | Beezley | 250/551 |
| 5,393,989 | 2/1995 | Gempe et al. | 250/551 |
| 5,442,335 | 8/1995 | Cantin et al. | 340/825.71 |
| 5,535,039 | 7/1996 | Belcher et al. | 359/187 |

*Primary Examiner*—Donnie L. Crosland
*Attorney, Agent, or Firm*—Morse & Altman

[57] ABSTRACT

An isolation amplifier that transmits data to a receiver via a current loop, where the isolated portion of the circuit is powered by a photovoltaic array illuminated by a light source powered directly by the current loop. Optionally, the photovoltaic array is additionally illuminated by any excess power tapped from the current loop by the non-isolated portion of the circuit. Preferably, the light source is an array of light-emitting diodes. Preferably the photovoltaic array is an array of photocells sensitive to the same wavelengths emitted by the light-emitting diodes. Preferably, there are optical conductors connecting the LED's to the photocells.

15 Claims, 6 Drawing Sheets

2-WIRE OPTOVOLTAIC LOOP-POWERED ISOLATION AMPLIFIER WITH CURRENT BOOTSTRAPPING

BACKGROUND OF THE INVENTION

1. Field of the Invention

The present invention relates to electrically-isolated sensors, more specifically, to isolation amplifiers that are optically powered directly by the current loop into which the isolated sensor signal is transmitted.

2. The Prior Art

Current loops have become the standard for many industrial and scientific applications where it is necessary to transmit analog information from a remote sensor. Current loops are insensitive to noise and are immune to is errors from line impedance. Current loops generally consist of a transmitter and a receiver connected by a wire pair. 4 to 20 milliampere (mA) transmitters are well-known devices that convert information represented by a voltage signal from the sensor into a current signal in the range of from 4 to 20 mA and sends it to a receiver via the wire pair. The receiver extracts information from the loop by measuring the amount of current drawn by the transmitter and translates the measured current into a voltage signal that corresponds to the sensor signal. Power to the loop is supplied through the receiver from a direct current (DC) supply that is normally in the range of from 15 to 35 volts DC (VDC), and is typically about 24 VDC.

Some applications require that the sensor be electrically isolated from the loop for reasons of safety, to protect the system electronics from electrical noise and transient signals, or in order to reject an unwanted common-mode signal. In the earlier prior art, sensor isolation was accomplished by using capacitive or inductive coupling, such as a transformer. In newer designs, isolation is being accomplished by using an optical isolator or optocoupler. The output of the sensor drives a light-emitting diode (LED) which, in turn, illuminates a photodetector, the output of which is the input to the transmitter. An amplifier is generally needed to amplify the sensor signal so that it can drive the LED. The combination of the amplifier and optocoupler is called an isolation amplifier.

In many cases, the sensor/amplifier/transmitter circuit does not have its own local power supply. This may be because of the cost and/or space associated with a separate power supply or the need to minimize the number of components in order to lower failure rates. In these cases, the transmitter extracts power directly from the current loop and supplies power to itself and the isolated portion of the circuit, including the sensor and isolation amplifier.

The power supplied to the sensor and isolation amplifier cannot be used directly if sensor isolation is to be maintained. Current designs employ a DC-to-AC-to-DC converter to supply power to the isolated portion of the circuit. The converter takes its DC input from the power extracted by the loop transmitter, converts it to high-frequency AC, transfers it via an inductive means, such as a transformer, to an AC-to-DC converter, where it is converted back to DC that is usable by the sensor and isolation amplifier.

There are two main drawbacks to this method of supplying isolated power to the sensor. The first is that the typical loop transmitter can only supply a small amount of power to the DC-to-AC-to-DC converter. The amount of if power that can be drawn from the loop by the transmitter is necessarily limited by the current levels required by the loop itself to effectively transmit the sensor signals. For example, a commercially available integrated circuit 4–20 mA current-loop transmitter, such as Analog Devices' AD693, is capable of supplying only 2 mA at 6.2 volts to the DC-to-AC-to-DC converter. And with the losses inherent in the DC-to-AC-to-DC conversion process, there is even less power available to operate the sensor and isolation amplifier.

Another drawback is that, in order to keep component sizes to a minimum, it is necessary to use high-frequency AC in the conversion process. This tends to produce electrical noise that causes unwanted interference with the other electronic components of the circuit, potentially resulting in erroneous measurements being transmitted over the current loop. To avoid the noise problem, the converter output power is filtered and the remainder of the circuit shielded from the converter components. This adds components, size, and expense to the circuit.

SUMMARY OF THE INVENTION

An object of the present invention is to provide a means for supplying power to an isolation amplifier and sensor while maintaining electrical isolation.

Another object is to eliminate the noise imposed on an isolated sensor circuit inherent in the DC-to-AC-to-DC conversion process currently used to provide isolated power.

A further object is to provide a means for supplying more power than is typically available to an isolation amplifier and sensor.

In the circuit of the present invention, an optically-isolated remote sensor transmits data via a 4–20 mA current loop to a receiver. A sensor drives an optocoupler, which, in turn, provides the input signal to a 4–20 mA current loop transmitter. The transmitter output drives the current loop, which terminates at a receiver. The transmitter taps the current loop to provide itself with power. This power, however, cannot be used to provide power to the isolated sensor circuit if isolation is to be maintained. Therefore, the present invention provides isolated power to an isolated sensor circuit by means of an optical transfer. The current loop by which data from the sensor is transmitted powers a light source that is arranged to illuminate a photovoltaic array. The photovoltaic array provides isolated power to the sensor circuit. Optionally, additional illumination is provided by a light source connected across the power supply tapped by the transmitter to take advantage of any excess power drawn by the transmitter.

The light source is preferably a plurality of LED's connected in series with each other and with the current loop. With a maximum voltage drop of 1.4 volts DC, ten LED's can be placed in series without significantly affecting the operation of the current loop in most situations. Preferably, the LED's radiate in the lower infrared wavelengths. The typical preferred LED has a peak intensity at a wavelength of approximately 880 nanometers (nm).

The photovoltaic array preferably is comprised of a plurality of photocells connected in series. The preferred photocells operate within a spectrum that at least covers that of the LED's and that has a peak sensitivity at approximately the same peak wavelength as the LED's.

Preferably, the LED's are positioned on an ILA circuit board so that they radiate perpendicularly to the board.

The photocells are positioned on a PVA circuit board such that the receptor surfaces of the photocells face away from the board, and they are arranged to match the LED arrangement. The circuit boards are positioned parallel to each other, where one LED radiates to the approximate center of one of the photocells. Other arrangements are also contemplated where there is not necessarily a one-to-one correspondence between the LED's and photocells.

The minimum distance between the photocells and LED's is governed by the maximum isolation voltage required by the circuit. The maximum distance is generally governed by the inverse-square law of radiant intensity as applied to the amount of current required from the photocells and any optical coupling between the photocells and LED's. The distance between the circuit board is maintained by rigid separators that also function as the electrical conductors between the circuit boards and the remainder of the circuit.

Preferably, there are optical conductors connecting the LED's to the photocells. The optical conductor can be designed to concentrate the light emitted by the LED onto the photocell so as much of the LED radiation as practical is used in an effort to boost the efficiency of the conversion process. Optionally, a clear separator is used instead of the optical conductor if it is merely necessary to maintain a minimum distance between the LED's and the photocells. Optionally, an optical condensing lens is used instead of the optical conductor. The lens concentrates the LED emissions to make the conversion process as efficient as practical.

Another novel aspect of the present invention is called current bootstrapping. The nature of the current loop is that as the sensor output increases, the loop current increases. This, in turn, increases the illumination of the LED's and increases the voltage output of the photocells. The reverse is also true: when the sensor output decreases the photocell output decreases. The sensor amplifier requires a minimum supply voltage, provided by the photocells, to operate properly. As the sensor signal increases, that minimum required supply voltage also increases. However, because of current bootstrapping, the supply voltage increases to meet the amplifier's increased need as the loop current increases. The benefit of such bootstrapping over a fixed supply voltage is that the higher output from the photocells obtainable with bootstrapping allows for lower optocoupler feedback and isolation output resistance, hence higher-speed response.

Other objects of the present invention will become apparent in light of the following drawings and detailed description of the invention.

BRIEF DESCRIPTION OF THE DRAWINGS

For a fuller understanding of the nature and object of the present invention, reference is made to the accompanying drawings, wherein.

DETAILED DESCRIPTION

Figure 1:
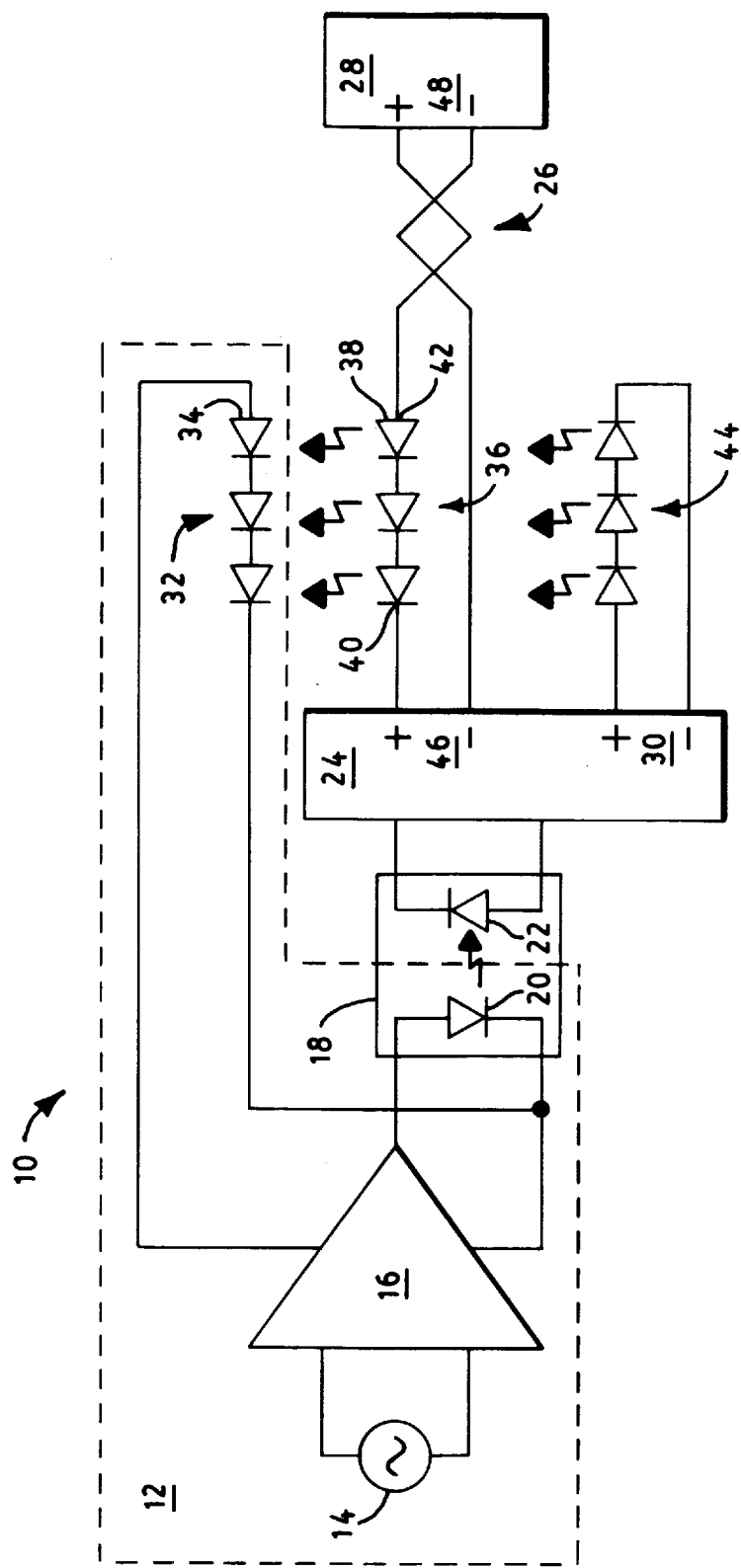
FIG. 1 is a block diagram of a circuit employing the present invention.

FIG. 1 shows a block diagram employing the present invention. The application is an optically-isolated remote sensor that transmits data via a 4–20 mA current loop. A sensor 14 is connected to the input of an amplifier 16, which increases the signal from the sensor 14 to a level sufficient to drive the LED 20 of an optocoupler 18. The optocoupler photodetector 22 provides the input signal to a 4–20 mA current loop transmitter 24. The transmitter output drives the current loop 26, which terminates at a receiver 28.

The transmitter 24 taps the current loop 26 to provide power for itself and any external circuitry, as at 30. However, if electrical isolation between the sensor 14 and the transmitter 24 is to be maintained, this local power supply 30 cannot be used to directly power the isolated side of the circuit 12, which includes the sensor 14, the amplifier 16, and the optocoupler LED 20. Therefore, the isolated side of the circuit 12 is powered by the DC voltage output of a photovoltaic array (PVA) 32. The PVA 32 is illuminated by an LED array 36 that is connected in series with the current loop)26. The LED's 38 of the LED array 36 are connected in series, anode-to-cathode. The LED array 36 is connected in series with the current loop 26 in one of several preferred configurations. In the most preferred configuration, shown in FIG. 1, the terminal cathode 40 (the cathode at the end of the LED array 36) is connected to the positive terminal of the transmitter output 46 and the terminal anode 42 (the anode at the other end of the LED array 36) is connected to the positive terminal of the receiver input 48. In a second configuration, the terminal anode is connected to the negative terminal of the transmitter and the terminal cathode is connected to the negative terminal of the receiver. In a third configuration, the LED's are connected in two series arrays. Then the terminal cathode of the first LED array is connected to the positive terminal of the transmitter, the terminal anode of the first LED array is connected to the positive terminal of the receiver, the terminal anode of the second LED array is connected to the negative terminal of the transmitter, and the terminal cathode of the second LED array is connected to the negative terminal of the receiver.

Optionally, a plurality of LED's 44 is serially connected across the local power supply 30. These LED's 44 provide a secondary source of illumination to the PVA 32 by using any excess power withdrawn from the current loop 26 by the transmitter 24.

Figure 2:
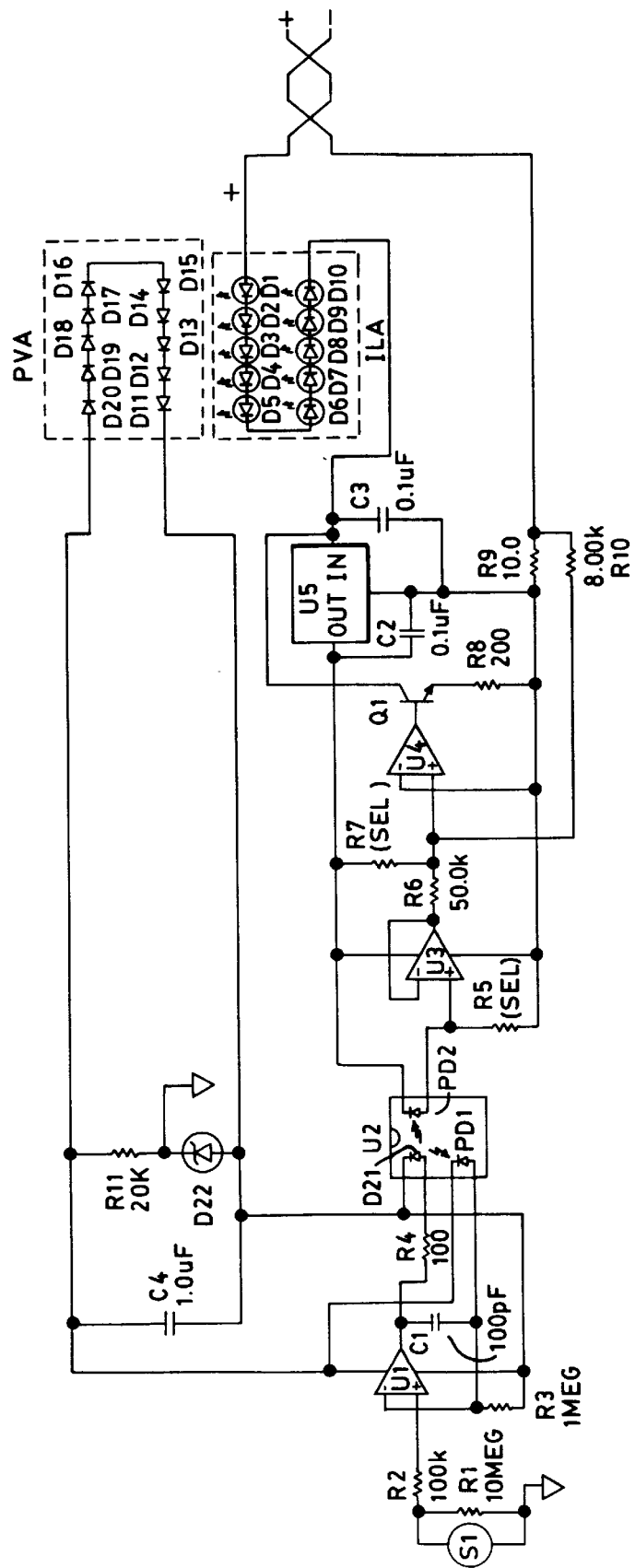
FIG. 2 is an electrical schematic of a circuit employing the present invention.

An electrical schematic of an operational circuit is shown in FIG. 2. Components U1, R1–R3, and C1 form a sensor amplifier that accepts the output from the sensor SI as its input. The sensor amplifier increases the voltage signal from the sensor S1 to a level sufficient to drive the internal LED D21 of an optocoupler U2. Resister R4 limits the LED current so as to not damage the LED D21 and to produce a voltage across C1 in order to keep the amplifier loop effectively closed. One photodetector PD1 of the optocoupler U2 is configured as a photoconductor and is used in the input biasing circuit of the sensor amplifier in order to compensate for the nonlinear time and temperature characteristics of the internal LED D21. The second optocoupler photodetector PD2 is also configured as a photoconductor and operates as the variable leg of a voltage divider that drives the input of a 4–20 mA current loop transmitter, which includes components U3, U4, Q1, and R5–R10. U3, R5, and R6 form a buffer amplifier to reduce the impedance of the optocoupler photodetector PD2. R5 is selected to compensate for the differences inherent in the two optocoupler photodetectors PD1, PD2. U4, Q1, and R7–R10 form a voltage-to-current translator to drive the current loop. R7 is selected so that when the input voltage is zero, the output current is 4 mA. A voltage regulator composed of U5, C2, and C3 taps the current loop to provide power and a reference voltage to the transmitter.

The isolated portion of the circuit, which includes the sensor and the isolation amplifier, is powered by the photovoltaic array PVA, which includes photocells D11–D21 connected in series with each other. The PVA is illuminated the LED array ILA, composed of the LED's D1–D10. The LED's D1–D10 are connected in series with each other and with the current loop, as described above.

Figure 3:
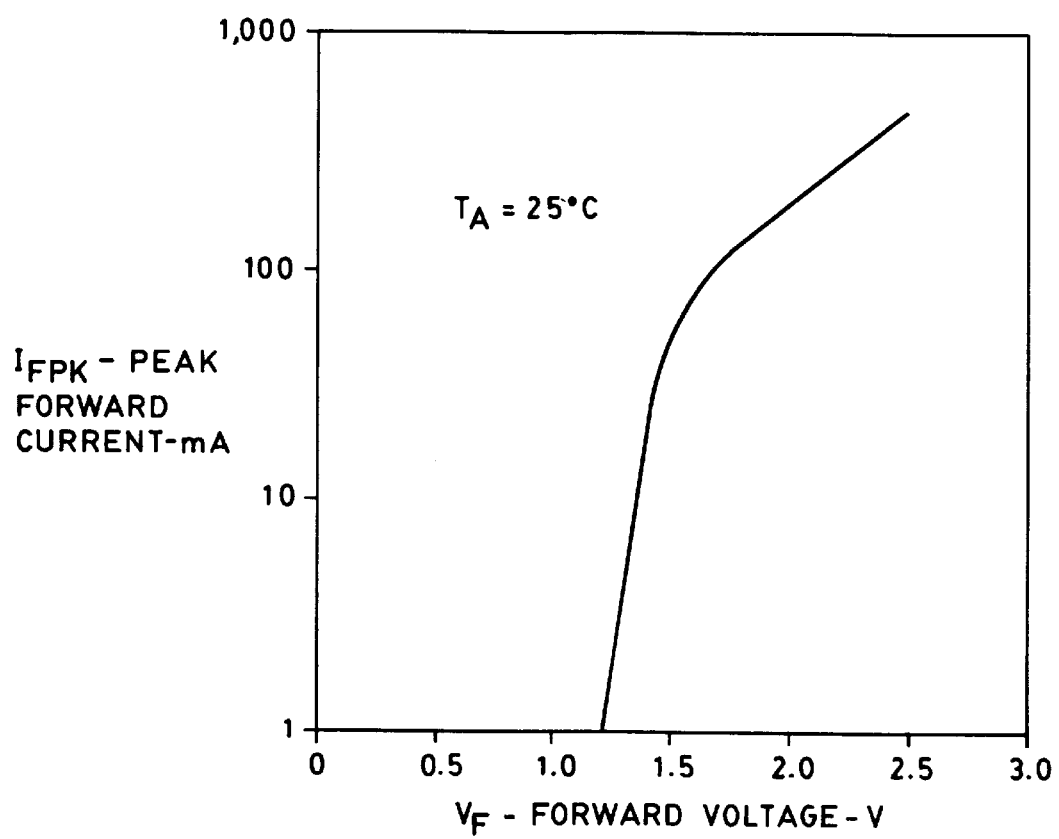
FIG. 3 is a curve showing peak forward current verses forward voltage for a typical LED used in the present invention.

For a 4–20 mA current loop, the typical voltage drop across each LED D1–D10 is in the range of from 1.2 to 1.4 VDC, as shown in the current-voltage curve of FIG. 3. When there are ten LED's in the series, as in FIG. 2, the maximum drop across the LED's is 14.0 VDC. When the typical 24-volt loop power supply is used, there is at least 10.0 VDC across the remainder of the loop, which is acceptable for most current loop applications.

Figure 4:
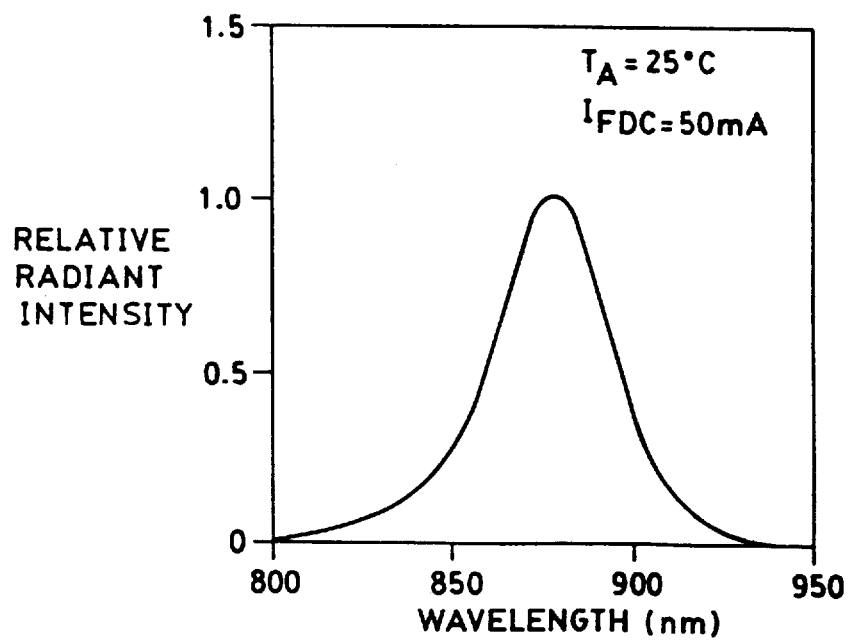
FIG. 4 is a curve showing relative radiant intensity verses wavelength for a typical LED used in the present invention.

The preferred LED's radiate most strongly in the lower infrared wavelength spectrum. These LED's are preferred because, as described below, the photocells convert infrared light most efficiently. FIG. 4 is a curve showing relative radiant intensity verses wavelength for the preferred LED. Note that the radiant intensity peaks at approximately 880 nanometers (nm), which is near the lower end of the infrared wavelength spectrum at 750 nm.

Figure 5:
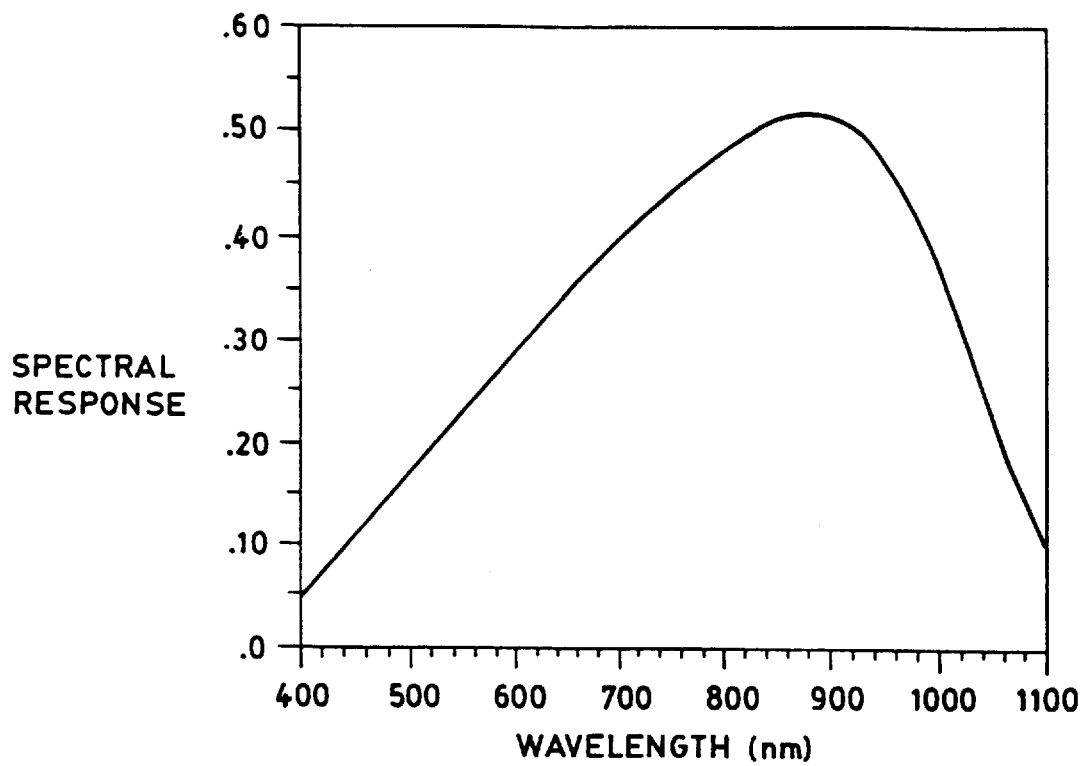
FIG. 5 is a curve showing spectral response verses wavelength for a typical photocell used in the present invention.

The current generated by the PVA for use by the isolated portion is a function of the spectrum and intensity of the light incident upon the PVA photocells D11–D20. As seen in the curve of FIG. 5, the preferred photocells respond to a wide frequency range. They are sensitive to entire range of wavelengths emitted by the LED's D1–D10 and are most efficient at approximately 880 nm, approximately the same wavelength at which the LED's D1–D10 are most efficient.

Figure 6:
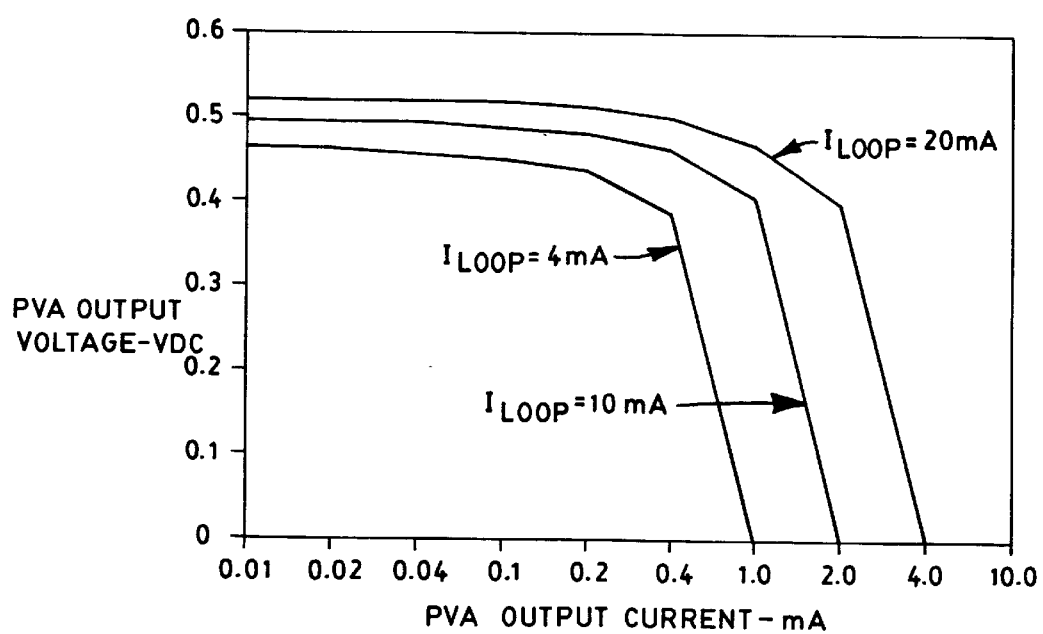
FIG. 6 is a curve showing output voltage verses output voltage at various current loop levels for a typical photocell/LED combination used in the present invention.

The output voltage verses output current from the preferred photocell for different loop currents is shown in FIG. 6. As the current drawn from the photocell increases, the voltage it supplies decreases. The decrease is relatively small for low current increases, but the voltage decreases dramatically for currents above approximately 0.4 mA. Note also that, as the loop current increases, the current and voltage available to the isolated portion of the circuit increases, although not in proportion with the loop current increase.

Figure 7:
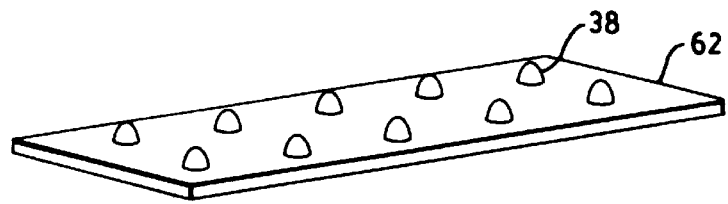
FIG. 7 is a perspective view of an ILA circuit board.
Figure 8:
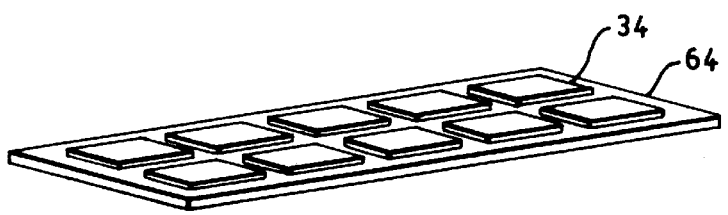
FIG. 8 is a perspective view of a PVA circuit board that mates with the ILA circuit board of FIG. 7.
Figure 9:
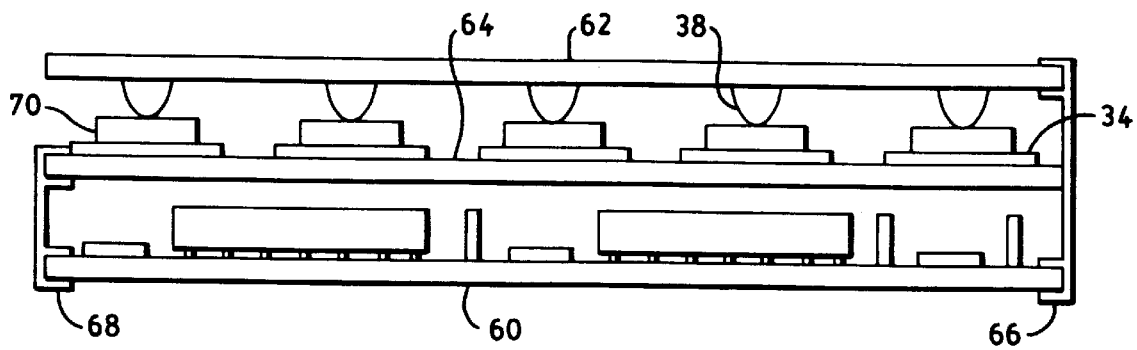
FIG. 9 is an elevational view of how the three circuits boards are preferably assembled together.

FIGS. 7–9 show the preferred manner in which the ILA and PVA are physically coupled. Initially, all of the components of the schematic of FIG. 2, with the exception of the PVA and ILA, are assembled on a main circuit board 60. The ILA LED's 38 are positioned on an ILA circuit board 62 so that the LED's 38 radiate perpendicularly to the circuit board 62. The LED's are arranged on the circuit board 62 in a rectangular matrix for convenience, not out of necessity. The PVA photocells 34 are positioned on a PVA circuit board 64 such that the receptor surfaces of the photocells 34 face away from the circuit board 64. The photocells 34 are arranged on the circuit board 64 to match the LED arrangement. The ILA and PVA circuit boards 62, 64 are positioned parallel to each other, where one LED 38 radiates to the approximate center of one of the photocells 34. In other contemplated configurations, there is not necessarily a one-to-one correspondence between the LED's and photocells. More than one LED may illuminate each photocell or more than one photocell is illuminated by each LED. The chosen configuration depends upon the electrical and physical parameters of the chosen LED's and photocells.

The minimum and maximum distance between the ILA 36 and PVA 32 depend upon the parameters of the chosen LED's 38 and photocells 34 and the level of signals from the sensor 14. The minimum distance is governed by the difference in voltage levels between the isolated side of the circuit 12 and the rest of the circuit. A typical optocoupler 18 has a maximum isolation voltage (the maximum allowable voltage difference between the optocoupler LED 20 and photodetectors 22, 24) of approximately 2500 V. In order to permit the circuit to operate to the isolation capability of the optocoupler 18, the isolation between the PVA 32 and ILA 36 must be at least that of the optocoupler 18. Consequently, the preferred minimum distance between the ILA 36 and PVA 32 is such that there is substantially no electrical leakage between the ILA 36 and PVA 32 at the maximum isolation voltage of the optocoupler 18.

The maximum distance is generally governed by the inverse-square law of radiant intensity as applied to the amount of current required from the PVA 32 and any optical coupling between the ILA 36 and PVA 32, as described below.

The distance between the PVA circuit board 62 and ILA circuit board 64 is maintained by rigid separators 66 between the main circuit board 60 and the ILA circuit board 62, and by rigid separators 68 between the main circuit board 60 and the PVA circuit board 64. The separators 66, 68 also function as the electrical conductors between the ILA and PVA circuit boards 62, 64 and the main circuit board 60. Thus there are at least two separators 66 between the main circuit board 60 and ILA circuit board 62, one for the negative connection and one for the positive connection, and at least two separators 68 between the main circuit board 60 and the PVA circuit board 64, one for the negative connection and one for the positive connection.

Preferably, there is at least one optical conductor 70 connecting each LED 38 with each photocell 34. The optical conductor 70 is a means by which light is transferred from one place to another. A common example is an optical fiber. The most preferred optical conductor is a clad rod consisting of a cylindrical glass coated with a glass of lower refractive index that prohibits light leakage. Clad rod is available in many diameters up to approximately ¼ inch. The optical conductor essentially removes the limitation on the maximum distance between the ILA 36 and PVA 32 because of the inverse-square law. In addition, the optical conductor 70 can be designed to concentrate the light emitted by the LED 38 onto the photocell 34 so as much of the LED radiation as practical is used in an effort to boost the efficiency of the conversion process.

Optionally, the optical conductor 70 is replaced by a clear separator between the LED's 38 and the photocells 34. The purpose of a clear separator is to assure that the minimum distance between LED's 38 and photocells 34 is maintained.

Optionally, the optical conductor 70 is replaced by an optical condensing lens between the LED's 38 and the photocells 34. The lens concentrates the light emitted by the LED 38 onto the photocell 34 so as much of the LED radiation as practical is used in an effort to boost the efficiency of the conversion process.

In FIG. 1, the optocoupler 18 requires that the forward drive current supplied to its internal LED 20 be several orders of magnitude greater than the resulting output currents of its photodetectors 22. For example, the typical optocoupler that would be used in the circuit of FIG. 2 has a gain in the range of 0.005 and 0.011, with a typical gain of 0.007, which means that an input current of 1 mA results in an output current of approximately 7 microamperes ($\mu A$). In turn, the forward current in the internal LED 20 must be supplied by the output of the PVA 32. Because the DC-DC conversion process between the ILA 36 and PVA 32 is rather inefficient, as described above, it can take several milliamperes of drive current into the ILA 36 to obtain a few microamperes of output current from the optocoupler photodetector 22.

One fortunate result of the circuit configuration of FIG. 1 is that the increasing output loop-current that results from increasing the output voltage level from the optocoupler photodetector 26 tends to make more current available from the PVA 32. This process, called current bootstrapping, is a novel feature of the invention.

Current bootstrapping works as follows. Assume that the PVA 32 of FIG. 1 is illuminated, not by the ILA 36, but by a fixed light source that is independent of the circuit. This fixed illumination produces a fixed output voltage from the PVA 32. That fixed output voltage supplies power to the sensor amplifier 16. The amplifier 16 has a substantially constant transfer function over a range of supply voltages, which means that there is a necessary minimum supply voltage required by the amplifier 16 for proper operation. That necessary minimum supply voltage is directly dependent upon the sensor signal to the amplifier 16: as the sensor signal increases, the necessary minimum supply voltage increases. Consequently, if the supply voltage from the PVA 32 is not high enough, the amplifier 16 will not operate properly for high sensor signals.

Now, assume that the PVA 32 is illuminated by the ILA 36. As the loop current increases, the light output of the ILA 36 increases, increasing the illumination of the PVA 32. This, in turn, increases the supply voltage to the amplifier 16. The loop current increases as the sensor signal increases and, conversely, the loop current decreases as the sensor signal decreases. Thus, as the sensor signal increases, demanding a higher necessary minimum supply voltage for the amplifier 16 to operate properly, the loop current increases, leading to an increase in the supply voltage to the amplifier 16. There is necessarily a lag between the sensor signal increase and the supply voltage to the amplifier 16. Thus, the circuit of the present invention operates best when the change in the sensor signal is relatively slow. The maximum frequency at which the circuit will operate depends upon the amount that the amplifier supply voltage is above the necessary minimum, which is dependent upon the actual components selected for the circuit.

The benefit of such bootstrapping over a fixed voltage input to the isolated portion 12 is that the higher output from the PVA 32 obtainable with bootstrapping allows for lower optocoupler feedback and isolation output resistance, hence higher-speed response. This is because, with higher available PVA currents, lower values for the feedback resistor R3 and isolator output shunt resistor R5 can be used. These lower values raises the frequency response of the circuit by lowering the effects of stray capacitances in the circuit.

Thus it has been shown and described an isolation amplifiers that is optically powered directly by the current loop into which the isolated sensor signal is transmitted which satisfies the objects set forth above.

Since certain changes may be made in the present disclosure without departing from the scope of the present invention, it is intended that all matter described in the foregoing specification and shown in the accompanying drawings be interpreted as illustrative and not in a limiting sense.

What is claimed is:

1. An electrical circuit for transmitting sensor data to a receiver via a current loop, said circuit comprising:
   (a) a current loop transmitter circuit;
   (b) a sensor circuit electrically isolated from said transmitter circuit;
   (c) a photovoltaic array for powering said sensor circuit; and
   (d) a primary light source directly powered by said current loop, said primary light source illuminating said photovoltaic array.

2. The circuit of claim 1 wherein said current loop operates in the range of from approximately 4 milliamperes to approximately 20 milliamperes.

3. The circuit of claim 1 wherein said sensor circuit is isolated from said transmitter circuit by an optocoupler.

4. The circuit of claim 1 wherein said transmitter circuit supplies power to itself by withdrawing power directly from said current loop.

5. The circuit of claim 4 wherein a secondary light source is powered by any excess power withdrawn by said transmitter circuit from said current loop, said secondary light source illuminating said photovoltaic array.

6. The circuit of claim 5 wherein said secondary light source includes at least one light-emitting diode.

7. The circuit of claim 1 wherein said photovoltaic array includes at least one photocell.

8. The circuit of claim 1 wherein said primary light source includes at least one light-emitting diode.

9. The circuit of claim 8 wherein said at least one light-emitting diode is connected in series with said current loop.

10. The circuit of claim 1 wherein an optical conductor is positioned between said primary light source and said photovoltaic array.

11. The circuit of claim 1 wherein an optical condensing lens is positioned between said primary light source and said photovoltaic array, said lens concentrating the light from said primary light source onto said photovoltaic array.

12. An electrical circuit for transmitting sensor data to a receiver via a 4–20 milliampere current loop, said circuit comprising:
   (a) a current loop transmitter circuit;
   (b) a sensor circuit electrically isolated from said transmitter circuit by an optocoupler;
   (c) a photovoltaic array including at least one photocell for powering said sensor circuit; and
   (d) a primary light source including least one light-emitting diode directly powered by said current loop, said primary light source illuminating said photovoltaic array.

13. The circuit of claim 12 wherein said transmitter circuit supplies power to itself by withdrawing power directly from said current loop and wherein a secondary light source including at least one light-emitting diode illuminates said photovoltaic array, said secondary light source being powered by any excess power withdrawn by said transmitter circuit from said current loop.

14. The circuit of claim 12 wherein an optical conductor is positioned between said primary light source and said photovoltaic array.

15. The circuit of claim 12 wherein an optical condensing lens is positioned between said primary light source and said photovoltaic array, said lens concentrating the light from said primary light source onto said photovoltaic array.

* * * * *